US009972555B2

(12) United States Patent
Kuroda et al.

(10) Patent No.: US 9,972,555 B2
(45) Date of Patent: May 15, 2018

(54) SEMICONDUCTOR DEVICE AND METHOD OF MANUFACTURING SAME

(71) Applicant: RENESAS ELECTRONICS CORPORATION, Tokyo (JP)

(72) Inventors: Soshi Kuroda, Tokyo (JP); Tatsuya Kobayashi, Tokyo (JP); Takanori Aoki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/662,127

(22) Filed: Jul. 27, 2017

(65) Prior Publication Data

US 2018/0033709 A1  Feb. 1, 2018

(30) Foreign Application Priority Data

Jul. 29, 2016  (JP) .................................. 2016-149631

(51) Int. Cl.
*H01L 29/76* (2006.01)
*H01L 23/31* (2006.01)
(Continued)

(52) U.S. Cl.
CPC ........ *H01L 23/3128* (2013.01); *H01L 21/565* (2013.01); *H01L 21/78* (2013.01); *H01L 22/32* (2013.01); *H01L 23/293* (2013.01); *H01L 23/3135* (2013.01); *H01L 23/49838* (2013.01); *H01L 23/535* (2013.01); *H01L 23/585* (2013.01); *H01L 24/06* (2013.01);
(Continued)

(58) Field of Classification Search
CPC ....... H01L 21/78; H01L 23/585; H01L 22/32; H01L 23/49838; H01L 24/48; H01L 23/3128; H01L 21/565; H01L 24/06; H01L 24/32; H01L 24/49; H01L 24/73
USPC .......................................................... 257/368
See application file for complete search history.

(56) References Cited

U.S. PATENT DOCUMENTS 7,625,779 B2 * 12/2009 Takahashi ............ G01R 1/0483
257/686
8,298,963 B2  10/2012 Akiba et al.
(Continued)

FOREIGN PATENT DOCUMENTS

JP  2010-021251 A  1/2010
JP  2010-171156 A  8/2010

*Primary Examiner* — Luan C Thai
(74) *Attorney, Agent, or Firm* — McDermott Will & Emery LLP

(57) ABSTRACT

To provide a semiconductor device having improved reliability. The semiconductor device has a wiring board, bonding land, semiconductor chip mounted on the wiring board via an adhesive layer and having a pad electrode, bonding wire connecting the pad electrode with the bonding land, and sealing body. The sealing body is, in a circuit formation region, in contact with an organic protection film and, in a scribe region and a region between the pad electrode and the scribe region, in contact with a surface protection film while not in contact with the organic protection film. A first side surface is closer to the circuit formation region side than a second one. The adhesive layer covers entirety of the semiconductor chip back surface and the second side surface of the semiconductor chip. The first side surface is in contact with the sealing body without being covered with the adhesive layer.

16 Claims, 14 Drawing Sheets

(51) Int. Cl.
*H01L 23/00* (2006.01)
*H01L 23/498* (2006.01)
*H01L 29/06* (2006.01)
*H01L 23/58* (2006.01)
*H01L 23/535* (2006.01)
*H01L 21/66* (2006.01)
*H01L 23/29* (2006.01)
*H01L 21/78* (2006.01)
*H01L 21/56* (2006.01)

(52) U.S. Cl.
CPC .............. *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 29/0649* (2013.01); *H01L 24/29* (2013.01); *H01L 2224/04042* (2013.01); *H01L 2224/05082* (2013.01); *H01L 2224/05124* (2013.01); *H01L 2224/05144* (2013.01); *H01L 2224/05147* (2013.01); *H01L 2224/06135* (2013.01); *H01L 2224/29014* (2013.01); *H01L 2224/29015* (2013.01); *H01L 2224/2919* (2013.01); *H01L 2224/30183* (2013.01); *H01L 2224/45147* (2013.01); *H01L 2224/73265* (2013.01); *H01L 2224/83201* (2013.01); *H01L 2224/92247* (2013.01); *H01L 2924/0665* (2013.01); *H01L 2924/10161* (2013.01); *H01L 2924/10253* (2013.01); *H01L 2924/13091* (2013.01)

(56) References Cited

U.S. PATENT DOCUMENTS

| 2010/0295044 | A1* | 11/2010 | Homma | H01L 22/32 257/48 |
|---|---|---|---|---|
| 2012/0104541 | A1* | 5/2012 | Chiu | H01L 23/10 257/508 |
| 2015/0206934 | A1* | 7/2015 | Funaya | H01L 22/34 438/3 |

* cited by examiner

# SEMICONDUCTOR DEVICE AND METHOD OF MANUFACTURING SAME

CROSS-REFERENCE TO RELATED APPLICATIONS

The disclosure of Japanese Patent Application No. 2016-149631 filed on Jul. 29, 2016 including the specification, drawings, and abstract is incorporated herein by reference in its entirety.

BACKGROUND

The present invention relates to a semiconductor device and a method of manufacturing same, in particular, to a technology effective when applied to a semiconductor device obtained by mounting a semiconductor chip on a board and then sealing them with a resin, and a method of manufacturing the device.

Japanese Unexamined Patent Application Publication No. 2010-21251 (Patent Document 1) discloses a technology of preventing a die bonding material from reaching the circuit formation surface of a semiconductor chip.

Japanese Unexamined Patent Application Publication No. 2010-171156 (Patent Document 2) discloses a step-cut dicing treatment in which after formation of a groove in a semiconductor wafer with a tapered blade, the semiconductor wafer is divided with a blade thinner than the width of the groove.

SUMMARY

Based on the investigation on a BGA (ball grid array) type semiconductor device having, for example, a wiring board, a semiconductor chip mounted on the wiring board via an adhesive layer, a plurality of bonding wires connecting between a plurality of terminals famed on the upper surface of the wiring board and pad electrodes of the semiconductor chip, and a sealing body obtained by covering the wiring board, the semiconductor chip, and the plurality of bonding wires with a resin, the present inventors have found the following problem.

The above-described semiconductor device is found to cause a phenomenon that cracks occur at a connection portion between the bonding wires and the pad electrodes in a temperature cycle test performed, for example, with 2000 cycles of temperature raising and lowering within a range (from −65° C. to 15° C.) in order to ensure reliability of the device. The cracks cause separation of the plurality of bonding wires from the pad electrodes, that is, open failure and the semiconductor device thus obtained has deteriorated reliability.

There is therefore a demand for providing a semiconductor device having improved reliability.

Another problem and novel features will be apparent from the description herein and accompanying drawings.

In one embodiment, there is provided a semiconductor device having a wiring board, a plurality of terminals placed around the wiring board, a semiconductor chip mounted on the wiring board via an adhesive layer and having a plurality of pad electrodes, a plurality of bonding wires connecting between the pad electrodes and the plurality of terminals, and a sealing body sealing the wiring board, the plurality of terminals, the semiconductor chip, and the plurality of bonding wires. The semiconductor chip has a first main surface, a back surface opposite to the first main surface, and a side surface for connecting the first main surface with the back surface. The first main surface has a rectangular shape including a first side and has a circuit formation region and a scribe region surrounding the circuit formation region. The plurality of pad electrodes are arranged in the peripheral portion of the circuit formation region along the first side. The semiconductor chip further has a first protection film composed of an inorganic insulating film that exposes the pad electrodes and covers the circuit formation region and the scribe region and a second protection film formed on the first protection film and composed of an organic insulating film that exposes the pad electrodes and the scribe region and covers the circuit formation region. The sealing body is in contact with the second protection film in the circuit formation region, while it is not in contact with the second protection film in the scribe region and in a region between the pad electrodes and the scribe region but in contact with the first protection film. The semiconductor chip has, as a side surface, a first side surface positioned in the scribe region and connected to the first main surface, a second side surface connected to the back surface. The first side surface is positioned on the side nearer to the circuit formation region than the second side surface is and the second side surface is longer than the first side surface. The adhesive layer covers the entirety of the back surface of the semiconductor chip and at the same time, covers the second side surface of the semiconductor chip. The first side surface is in contact with the sealing body without being covered with the adhesive layer.

According to the one embodiment, a semiconductor device having improved reliability can be provided.

DETAILED DESCRIPTION

Figure 1:
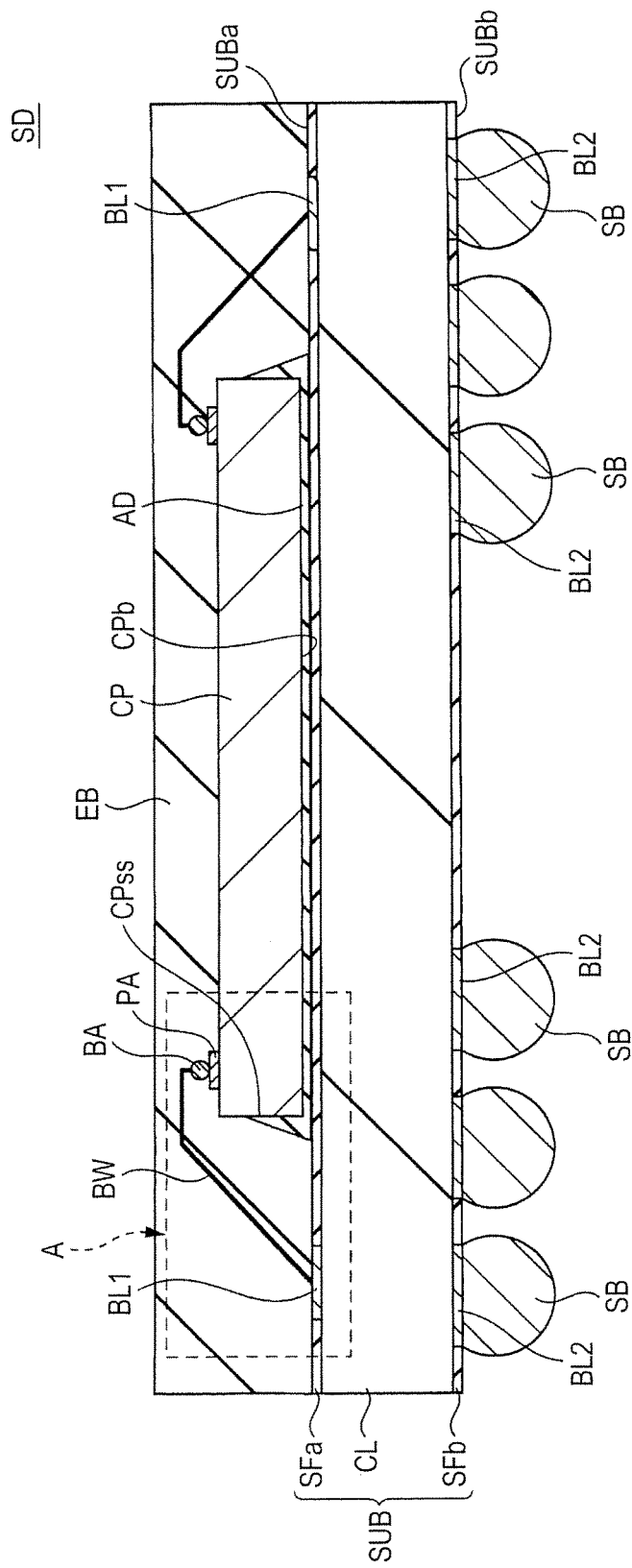
FIG. 1 is a cross-sectional view of a semiconductor device of First Embodiment.

In the following embodiment, a description may be made after divided into a plurality of sections or embodiments if necessary for the sake of convenience. These sections or embodiments are not independent from each other unless otherwise particularly specified, but one of them may be a modification example, details, complementary description, or the like of a part or whole of the other one.

In the following embodiment, when a reference is made to the number (including the number, value, amount, range, or the like) of a component, the number is not limited to a specific number but may be more or less than the specific number, unless otherwise particularly specified or principally apparent that the number is limited to the specific number.

Further, in the following embodiment, it is needless to say that the constituent component (including component step or the like) is not always essential unless otherwise particularly specified or principally apparent that it is essential.

Similarly, in the following embodiment, when a reference is made to the shape, positional relationship, or the like of the constituent component, that substantially approximate or analogous to it is also embraced unless otherwise particularly specified or principally apparent that it is not. This also applies to the above-mentioned value, range, or the like.

In all the drawings for describing the embodiments, same members will be identified by the same reference numerals and overlapping descriptions will be omitted. To facilitate understanding the drawings, even a plan view may be hatched.

Embodiment

In the present embodiment, a BGA (ball grid array) type semiconductor device is described as an example. First, a semiconductor device of an investigation example and a problem of the device are described.

Investigation Example

Figure 14:
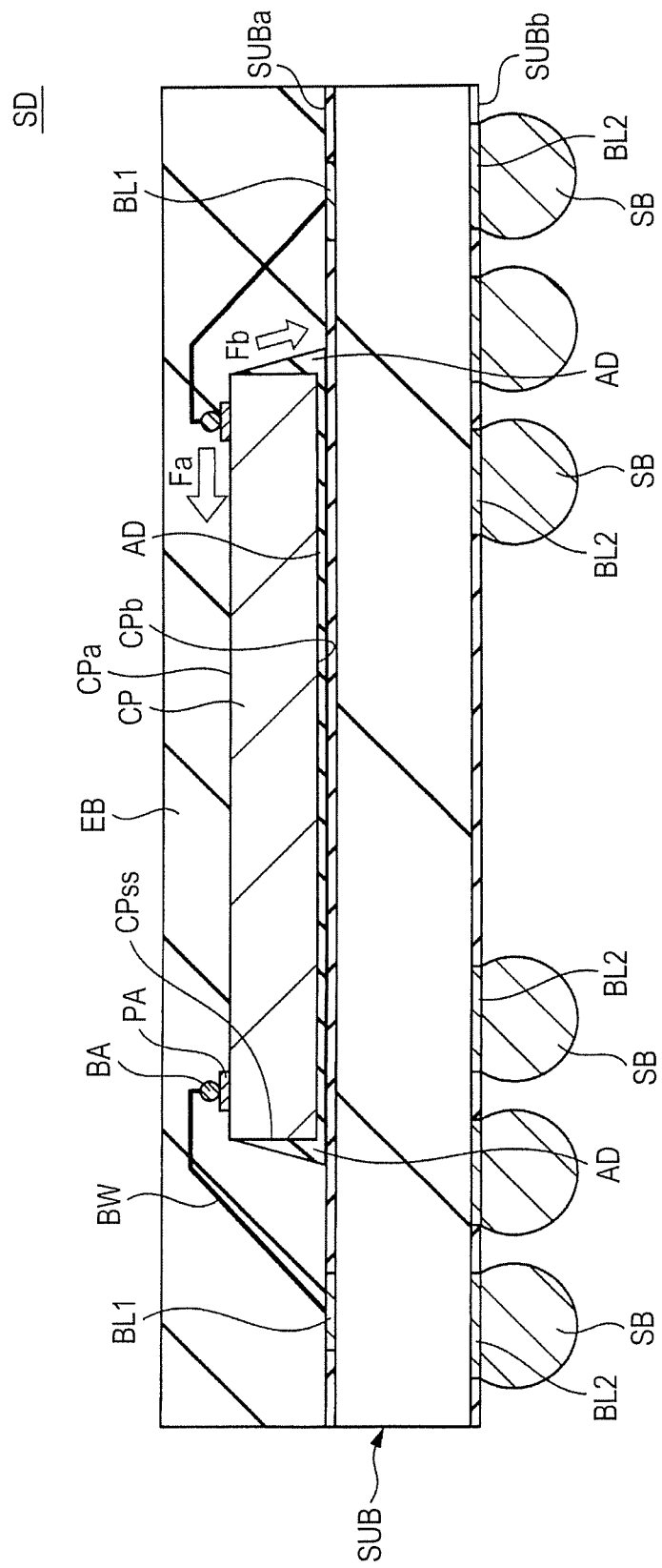
FIG. 14 is a cross-sectional view of a semiconductor device which is an investigation example.

FIG. 14 is a cross-sectional view of the semiconductor device of the investigation example. The semiconductor device has a wiring board SUB, a semiconductor chip CP mounted on the wiring board SUB via an adhesive layer AD, a plurality of bonding wires BW for connecting a plurality of bonding lands (terminals) BL1 formed on the main surface of the wiring board SUB with pad electrodes PA of the semiconductor chip CP, and a sealing body EB that has covered the wiring board SUB, the semiconductor chip CP, and the plurality of bonding wires BW with a resin.

In this Example, the semiconductor chip CP is made of, for example, single crystal silicon and it has a linear expansion coefficient of about 4 ppm/K. The adhesive layer AD is made of a thermosetting epoxy resin containing a filler such as alumina and it has a linear expansion coefficient of from about 40 to 50 ppm/K. The sealing body EB is a thermosetting epoxy resin containing a filler such as silica and it has a linear expansion coefficient of from about 10 to 40 ppm/K. The wiring board SUB is made of glass epoxy, that is, glass fibers impregnated with an epoxy resin and it has a linear expansion coefficient of from about 10 to 15 ppm/K. The bonding wire BW is, for example, a copper (Cu) wire and the pad electrode PA is made of, for example, an aluminum layer.

The adhesive layer AD not only covers the whole region (entirety) of the back surface CPb of the semiconductor chip CP but also covers the side surface (side wall) CPss of the semiconductor chip. The adhesive layer AD therefore reaches the vicinity of the main surface CPa of the semiconductor chip CP. This means that since after supply (application) of a relatively large amount of the paste-like adhesive layer AD to the wiring board SUB, the semiconductor chip CP is pressed against and attached to it, the adhesive layer AD overflows even to the side surface CPss of the semiconductor chip CP and creeps up the side surface CPss of the semiconductor chip CP to form a triangle fillet shown in FIG. 14.

By using a relatively large amount of the adhesive layer AD, remaining of voids (pores) in the adhesive layer AD between the wiring board SUB and the back surface CPb of the semiconductor chip CP can be reduced or prevented. When voids remain in the adhesive layer, however, the semiconductor device SD becomes hot at the time of a temperature cycle test, mounting, or operation of the semiconductor device SD and due to cubical expansion of air or water in the voids, cracks occur in the adhesive layer AD or the semiconductor chip CP. It is therefore important not to leave voids in the adhesive layer AD between the wiring board SUB and the back surface CPb of the semiconductor chip CP.

Although a description on the mechanism is omitted, a triangle fillet on the side surface CPss of the semiconductor chip CP can reduce or prevent disconnection of main surface wirings famed on the main surface side (the side on which the semiconductor chip CP is to be formed) of the wiring board SUB.

It is therefore important to reduce voids in the adhesive layer Ad and form a fillet on the side surface CPss of the semiconductor chip CP.

It is however difficult to control the supply amount (application amount) of the paste-like adhesive layer AD with high precision, because the paste-like adhesive layer AD is usually supplied using, for example, an apparatus like an injector called "dispenser". As shown in FIG. 14, the adhesive layer AD that covers the side surface CPss of the semiconductor chip CP therefore reaches even the vicinity of the main surface CPa of the semiconductor chip CP.

As a result of the investigation by the present inventors, it has been confirmed that when the semiconductor device SD having such a structure is subjected to the above-described temperature cycle test, a failure occurs, more specifically, cracks appear at a joint portion between the bonding wire BW and the pad electrode PA and cause separation of the bonding wire BW from the pad electrode PA.

On the low-temperature side of the temperature cycle test, both the semiconductor chip CP and the sealing body EB shrink, but due to a difference in thermal expansion coefficient between them, a stress Fa toward the center portion side of the semiconductor chip CP is applied to the bonding wire BW. In addition, due to shrinkage of the adhesive layer AD that covers the side surface CPss of the semiconductor chip CP, a stress Fb toward the outside of the semiconductor chip CP is applied to the end portion of the main surface CPa of the semiconductor chip CP. The present inventors have presumed that the stress Fa and the stress Fb may cause cracks at the joint portion between the bonding wire BW and the pad electrode PA and also cause separation of the bonding wire BW. As the pad electrode PA is arranged closer to the end portion of the main surface CPa of the semiconductor chip CP, cracks are likely to occur. This means that the stress Fb derived from shrinkage of the adhesive layer AD that covers the side surface CPss of the semiconductor chip CP has a great influence on occurrence of cracks.

Figure 2:
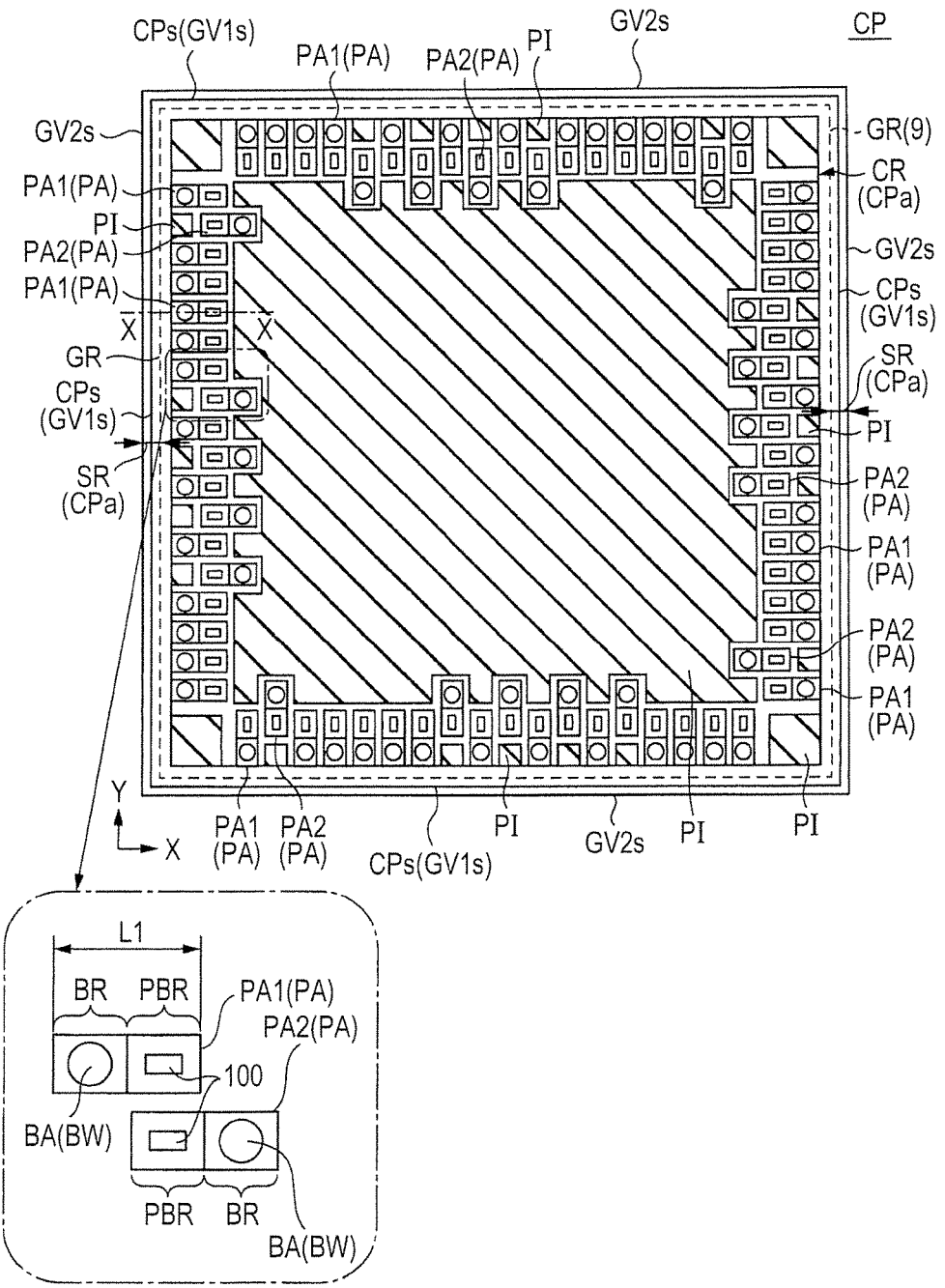
FIG. 2 is a plan view of a semiconductor chip which is a portion of the semiconductor device of First Embodiment.

It has also been confirmed that as shown in FIG. 2, particularly when the semiconductor chip CP has, at the center portion thereof, an organic protection film made of an organic insulating film such as polyimide layer but has no organic protection film in a region between the pad electrode PA and the end portion of the main surface CPa of the semiconductor chip CP, cracks are likely to occur. This means that since the pad electrode PA and the end portion of the main surface CPa of the semiconductor chip CP are too close to each other to form an organic protection film in a region between the pad electrode PA and the end portion of the main surface CPa of the semiconductor chip CP, cracks are likely to occur. Further, the semiconductor chip CP has, at the end portion of the main surface CPa thereof, no organic protection film, which deteriorates the adhesiveness between the sealing body EB and the main surface of the semiconductor chip CP. The cracks are therefore likely to occur.

The present embodiment, therefore, provides a structure and a manufacturing method capable of reducing or preventing generation of the cracks.

<Semiconductor Device>

Figure 3:
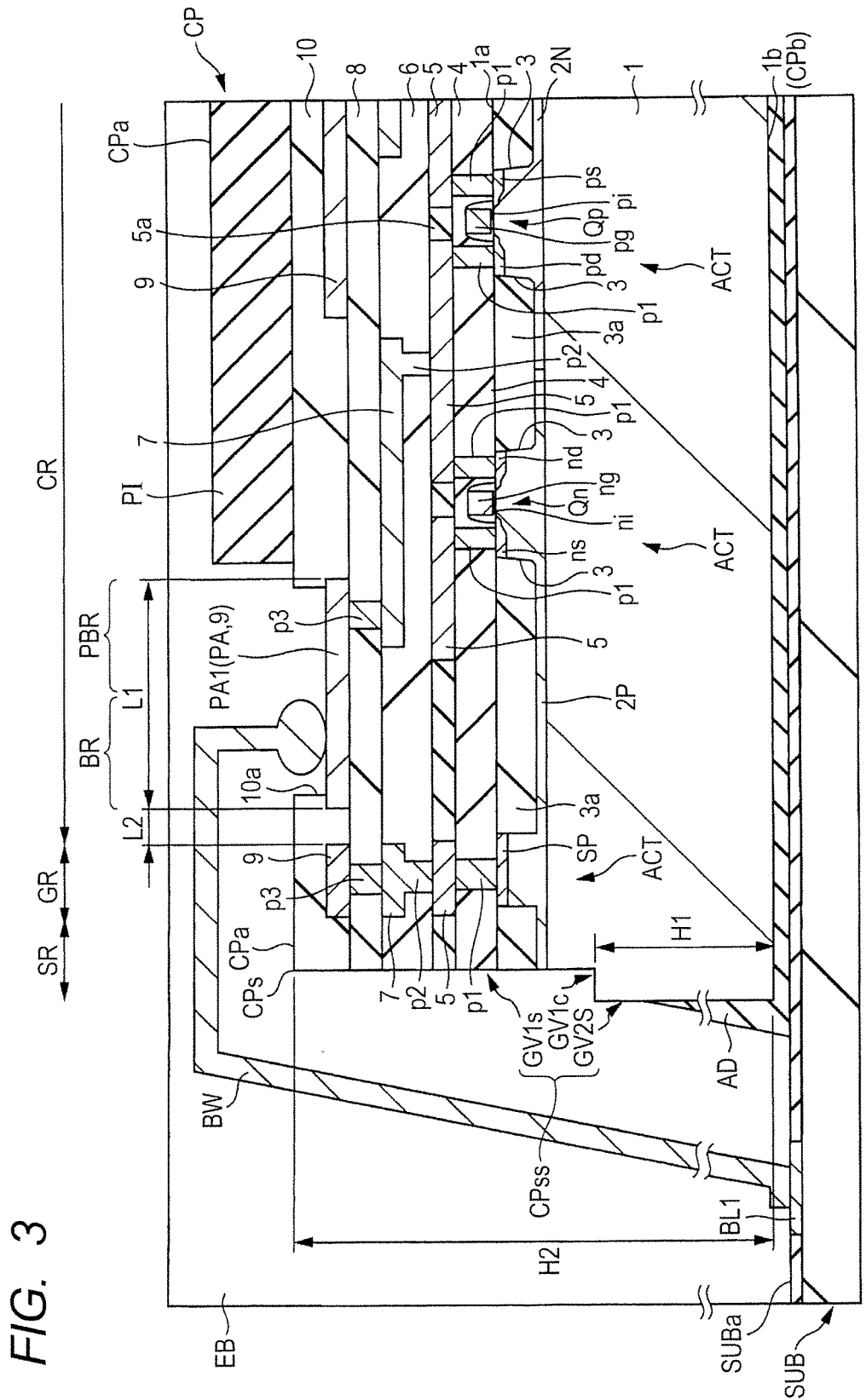
FIG. 3 is an enlarged cross-sectional view of the portion A of FIG. 1.

FIG. 1 is a cross-sectional view of a semiconductor device of the present embodiment; FIG. 2 is a plan view of a semiconductor chip, which is a portion of the semiconductor device of the present embodiment; and FIG. 3 is an enlarged cross-sectional view of the portion A of FIG. 1. FIG. 3 is a cross-sectional view taken along the line X-X of FIG. 2.

As shown in FIG. 1, the semiconductor device has a wiring board (base material) SUB, a semiconductor chip CP mounted on the main surface SUBa of the wiring board SUB via an adhesive layer AD, a plurality of bonding wires BW connecting between a plurality of bonding lands (terminals) BL1 formed on the main surface SUBa of the wiring board SUB and pad electrodes PA of the semiconductor chip CP, and a sealing body EB that has covered the wiring board SUB, the semiconductor chip CP, and the plurality of bonding wires BW with a resin.

The wiring board SUB has a core layer CL made of glass epoxy obtained by impregnating glass fibers with an epoxy resin, a plurality of bonding lands BL1 and a plurality of ball lands BL2 famed on the main surface and back surface of the core layer CL, respectively, and solder resist layers SFa and SFb that cover the main surface and the back surface of the core layer CL, respectively.

Although not shown in this drawing, the bonding lands BL1 surround, in ring form, the semiconductor chip CP mounted at the center portion of the wiring board SUB. Although not shown in this drawing, the ball lands BL2 surround the wiring board SUB in a plurality of rows (in three rows in FIG. 1) in ring form on the back surface SUBb of the wiring board SUB.

Although not shown in this drawing, the core layer CL has, on the main surface thereof, a plurality of main surface wirings, which are formed in the same wiring layer as that having therein the plurality of bonding lands BL1. The main surface wirings are covered with a solder resist layer SFa and are electrically isolated from the semiconductor chip CP to be arranged thereon to prevent short-circuiting. The plurality of bonding lands BL1 with which the bonding wires BW are connected, respectively, are exposed from the solder resist layer SFa.

Although not shown in this drawing, the core layer CL has, on the back surface thereof, a plurality of back surface wirings formed in the same wiring layer as that having therein the ball lands BL2. The back surface wirings are covered with a solder resist layer SFb, but the ball lands BL2 are exposed from the solder resist layer SFb. To the ball lands BL2, a solder ball SB made of a solder material is connected.

Further, the bonding lands BL1 are each electrically connected with the ball lands BL2 corresponding thereto. The bonding lands BL1 and the ball lands BL2 contain, for example, a copper (Cu) layer and a gold (Au) plating layer famed on the surface thereof. The solder resist layers SFa and SFb are made of an organic insulating film.

As shown in FIG. 1, the back surface CPb of the semiconductor chip CP is stuck to the main surface SUBa of the wiring board SUB via the adhesive layer AD. The adhesive layer AD covers the whole region (entirety) of the back surface CPb of the semiconductor chip CP and at the same time, partially covers the side surface CPss. Over the entire periphery of the semiconductor chip CP, the adhesive layer AD continuously creeps up the side surface CPss from the back surface CPb of the semiconductor chip CP. In other words, since the back surface CPb of the semiconductor chip CP and the main surface SUBa of the wiring board SUB have therebetween the adhesive layer AD over the whole region of the back surface CPb of the semiconductor chip CP, almost no void (pore) is present.

The semiconductor chip CP has thereon a plurality of pad electrodes PA and these pad electrodes PA are connected with the bonding lands BL1 via a bonding wire BW. The bonding wire BW has, at one end thereof, a spherical ball portion BA and this ball portion BA is connected with the pad electrode PA. The bonding wire BW is, for example, a copper (Cu) wire and the pad electrode PA is made of, for example, an aluminum layer. The bonding wire BW may alternatively be a gold (Au) wire.

Further, as shown in FIG. 1, the main surface SUBa of the wiring board SUB, the semiconductor chip CP, and the bonding wire BW are covered with a sealing body EB. The sealing body EB is made of an epoxy resin containing a filler such as silica.

As shown in FIG. 2, the main surface CPa of the semiconductor chip CP has a square shape having four sides CPs in plan view. It may be oblong (rectangular). Such a quadrangle (square or oblong) embraces a shape having corner portions each chamfered. The semiconductor chip CP has, on the main surface CPa thereof, a circuit formation region CR, a scribe region SR surrounding it, and a guard ring GR provided at the boundary between the circuit formation region CR and the scribe region SR. The guard ring GR has a quadrangular ring shape continuously surrounding the periphery of the circuit formation region CR.

The circuit formation region CR has, at the periphery thereof, the pad electrodes PA along each of the sides CPs of the semiconductor chip CP. In the present embodiment, the semiconductor chip CP has, in a region surrounded by this periphery, in other words, at the center portion of the main surface CPa, no pad electrode PA. The pad electrodes PA each have a bonding region BR with which the ball portion BA of the bonding wire BW is connected and a probe region PBR in which a probe mark 100 that has remained after the contact of a probe needle with the pad electrodes. In order to determine the electrical properties of the semiconductor chip CP, a test is made by bringing a probe needle into contact with each of the pad electrodes PA. Improved connection reliability can be achieved between the ball portion BA of the bonding wire BW and the pad electrode PA by differentiating the probe region PBR with which the probe needle is brought into contact from the bonding region BR. The probe mark (flaw) 100 remains in the probe region PBR after the probe needle is brought into contact with the pad electrode.

The pad electrode PA is oblong or substantially oblong and it has, in the long side direction thereof, the bonding region BR and the probe region PBR. The long side has a length L1. The pad electrodes PA each have the bonding region BR and the probe region PBR thereof in a direction orthogonal to a side CPs to which the pad electrode PA is adjacent. The oblong pad electrode PA has its long side in a direction orthogonal to the side CPs to which the pad electrode PA is adjacent. The term "the side CPs to which the pad electrode PA is adjacent" (which will hereinafter be called "adjacent side CPs") means a side CPs that extends in a direction orthogonal to the long side of the pad electrode PA and is, at the same time, on the side near this pad electrode PA.

In the present embodiment, the pad electrodes PA include an outer pad electrode PA1 and an inner pad electrode PA2. Compared with the inner pad electrode PA2, the outer pad electrode PA1 is on the side nearer the adjacent side CPs. Compared with the inner pad electrode PA2, the outer pad electrode PA1 is on the outer side of the semiconductor chip CP.

In the outer pad electrode PA1, compared with the probe region PBR, the bonding region BR is nearer to the adjacent side CPs. In the inner pad electrode PA2, on the other hand, compared with the probe region PBR, the bonding region BR is more distant from the adjacent side CPs. In other words, the bonding region BR of the outer pad electrode PA1 is arranged in an outer portion of the semiconductor chip CP and the probe region PBR is arranged in an inner portion of the semiconductor chip CP. The bonding region BR of the inner pad electrode PA2 is arranged in an inner portion of the semiconductor chip CP and the probe region PBR is arranged in an outer portion of the semiconductor chip CP.

By shifting the positions of the outer pad electrode PA1 and the inner pad electrode PA2, the probe region PBR of the outer pad electrode PA1 and that of the inner pad electrode PA2 can be arranged in a line (on a virtual straight line) parallel to the adjacent side CPs. This facilitates contact of the probe needle during the test. In addition, since the bonding region BR of the outer pad electrode PA1 can be kept away from that of the inner pad electrode PA2, the distance between the outer pad electrode PA1 and the inner pad electrode PA2 adjacent to each other can be decreased in a direction parallel to the adjacent side CPs.

As shown in FIG. 2, the circuit formation region CR except the pad electrodes PA has been covered with the organic protection film PI made of an organic insulating film such as polyimide layer. The scribe region SR and the guard ring GR have no organic protection film PI thereon and the scribe region SR and the guard ring GR are exposed from the organic protection film PI. The guard ring GR covered with the surface protection film 10 as shown in FIG. 3 is indicated by a broken line in FIG. 2 for convenience sake. In addition, the circuit formation region CR is surrounded with the guard ring GR as shown in FIG. 2. Further, as shown in FIG. 2, the guard ring GR is surrounded with the scribe region SR (or the side CPs of the main surface CPa of the semiconductor chip CP positioned in the scribe region SR). The semiconductor chip CP extensively has, in a region thereof surrounded with a row of the pad electrodes PA positioned along the four sides CPs, in other words, at the center portion of the main surface CPa thereof, the organic protection film PI. Further, the semiconductor chip has, in a region thereof sandwiched between the pad electrodes PA at the collier portion of the circuit formation region CR and in a region thereof sandwiched between the inner pad electrode PA2 and the outer pad electrodes PA1 on both sides thereof, the organic protection film PI. No organic protection film PI is arranged in the scribe region SR in order to prevent a failure attributable to clogging of a dicing blade in a first dicing step described later. In addition, no organic protection film PI is arranged between the outer pad electrode PA1 and the scribe region SR in order to prevent a reduction in production yield attributable to separation of an organic protection film PI with a small area.

Next, FIG. 3 is an enlarged cross-sectional view of the portion A of FIG. 1 and a cross-sectional view taken along the line X-X of FIG. 2. In short, it is a cross-sectional view taken along the outer pad electrode PA1. Although the sealing body EB shown in FIG. 1 is omitted from FIG. 3, the main surface CPa and the side surface CPss of the semiconductor chip CP shown in FIG. 3 are in contact with the sealing body EB, as is apparent from FIG. 1.

As shown in FIG. 3, the semiconductor chip CP has an n channel MIS transistor (Qn) and a p channel MIS transistor (Qp) formed on the main surface 1a of the semiconductor substrate 1 and a multilayer wiring structure formed on them.

First, a description is made on the circuit formation region CR. The semiconductor substrate 1 made of, for example, p type single crystal silicon has a p well (semiconductor region) 2P, an n well (semiconductor region) 2N, and an element isolation trench 3. The element isolation trench 3 has therein a buried element isolation film 3a made of, for example, a silicon oxide film.

The p well 2P has therein many n channel MIS transistors (Qn). The n channel MIS transistor (Qn) is fouled in an active region ACT defined by an element isolation trench 3 and has a source region ns and a drain region nd faulted in the p well 2P and a gate electrode ng formed on the p well 2P via a gate insulating film ni. The n well 2N has therein many p channel MIS transistors (Qp). The p channel MIS transistor (Qp) is formed in an active region ACT defined by an element isolation trench 3 and has a source region ps and a drain region pd formed in the n well 2N and a gate electrode pg formed on the n well 2N via a gate insulating film pi.

The n channel MIS transistor (Qn) and the p channel MIS transistor (Qp) have thereon a wiring made of a metal film and connecting between semiconductor elements. The wirings that connect between semiconductor elements configure a multilayer wiring structure having usually from about 3 to 10 layers. FIG. 3 shows, as one example of a multilayer wiring, two wiring layers comprised of a metal film composed mainly of a copper alloy (first-layer Cu wiring 5, second-layer Cu wiring 7) and one wiring layer (third-layer Al wiring 9) comprised of a metal film composed mainly of an Al alloy. The term "wiring layer" is used collectively for a plurality of wirings formed in each wiring layer. With respect to the thickness of the wiring layer, the second wiring layer is thicker than the first wiring layer and the third wiring layer is thicker than the second wiring layer.

The n channel MIS transistor (Qn) or the p channel MIS transistor (Qp) and the first-layer Cu wiring 5, the first-layer Cu wiring 5 and the second-layer Cu wiring 7, and the second-layer Cu wiring 7 and the third layer Al wiring 9 have therebetween interlayer insulating films 4, 5a, 6, and 8 each made of a silicon oxide film and plugs p1, p2, and p3 for electrically connecting among the three layers.

The interlayer insulating film 4 is formed on the semiconductor substrate 1 so as to cover, for example, a semiconductor element and the first-layer Cu wiring 5 is formed in the interlayer insulating film 5a on this interlayer insulating film 4. The first-layer Cu wiring 5 is electrically connected with the source region ns, the drain region nd, and the gate electrode ng of the n channel MIS transistor (Qn), which is a semiconductor element, for example, via a plug p1 formed in the interlayer insulating film 4. The first-layer Cu wiring 5 is electrically connected with the source region ps, the drain region pd, and the gate electrode pg of the p channel MIS transistor (Qp), which is a semiconductor element, via a plug p1 formed in the interlayer insulating film 4. FIG. 3 does not show connection between the gate electrode ng or pg with the first-layer Cu wiring 5. The plugs p1, p2, and p3 are made of a metal film, for example, a W (tungsten) film or a copper (Cu) film. The first-layer Cu wiring 5 is formed in a wiring trench of the interlayer insulating film 5a by the damascene process and the first-layer Cu wiring 5 has a stacked structure of a barrier conductor film and a conductor film formed thereon and composed mainly of copper. The barrier conductor film is made of tantalum (Ta), titanium (Ti), ruthenium (Ru), tungsten (W), or manganese (Mn), a nitride or nitride/silicide thereof, or a stacked film of them. The conductor film composed mainly of copper is made of copper (Cu) or a copper alloy (an alloy between copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), In (indium), a lanthanoid-based metal, or actinoid-based metal).

The second-layer Cu wiring 7 is electrically connected with the first-layer Cu wiring 5, for example, via a plug p2 formed in the interlayer insulating film 6. The third-layer Al wiring 9 is electrically connected with the second-layer Cu wiring 7, for example, via a plug p3 formed in the interlayer insulating film 8. The plug p3 is made of a metal film, for example, a W (tungsten) film.

The second-layer Cu wiring 7 and the plug p2 are formed integrally in the interlayer insulating film 6 and the second-layer Cu wiring 7 and the plug p2 are comprised of a stacked structure of a barrier conductor film and a conductor film formed thereon and composed mainly of copper. The barrier conductor film and the conductor film composed mainly of copper are made of materials same as those of the first-layer Cu wiring 5.

The first-layer Cu wiring 5 and the interlayer insulating film 6 and the second-layer Cu wiring 7 and the interlayer insulating film 8 preferably have therebetween a barrier insulating film for preventing diffusion of copper into the interlayer insulating films 6 and 8, respectively. As the barrier insulating film, a SiCN film or a stacked film of a SiCN film and a SiCO film can be used.

The third-layer Al wiring 9 is made of an aluminum alloy film (for example, an Al film added with Si and Cu), but it may be a Cu wiring.

The interlayer insulating films 4, 5a, 6, and 8 are each made of a silicon oxide ($SiO_2$) film, but an insulating film having a dielectric constant lower than that of a silicon oxide film and called "Low-k film" may be used, instead. For example, needless to say, they may be made of a monolayer film, for example, a carbon-containing silicon oxide film (SiOC film), a nitrogen- and carbon-containing silicon oxide film (SiCON film), or a fluorine-containing silicon oxide film (SiOF film), or a stacked film thereof.

The third-layer Al wiring 9, which is the top layer of the multilayer wiring, has thereon a surface protection film (protection film, insulating film) 10 comprised of a monolayer film such as silicon oxide film or silicon nitride film or comprised of two layer films of them, as a final passivation film. The surface protection film 10 is made of an inorganic insulating film. The third-layer Al wiring 9, which is the top wiring layer exposed from the bottom portion of a pad opening (opening) 10a formed in this surface protection film 10 configures a pad electrode (pad, electrode pad) PA. The pad electrode PA has a bonding region BR and a probe region PBR and a bonding wire BW is connected with the bonding region BR.

Further, the surface protection film 10 has thereon an organic protection film PI made of an organic insulating film such as polyimide layer. The organic protection film PI widely covers an area of the circuit formation region CR inside the pad electrode PA and exposes the pad electrode PA, the guard ring GR, and the scribe region SR.

Next, as shown in FIG. 3, the guard ring GR is comprised of a stacked structure of a semiconductor region SP formed in the active region ACT of the main surface 1a of the semiconductor substrate 1, the plug p1, the first-layer Cu wiring 5, the plug p2, the second-layer Cu wiring 7, the plug p3, and the third-layer Al wiring 9. This means that the third-layer Al wiring 9 is connected with the plug p3, the plug p3 is connected with the second-layer Cu wiring 7, the second-layer CU wiring 7 is connected with the plug p2, the plug p2 is connected with the first-layer Cu wiring 5, and the first-layer Cu wiring 5 is connected with the semiconductor region SP. As shown in FIG. 2, the guard ring GR continuously surrounds the entire periphery of the circuit formation region CR. This means that the semiconductor region SP, the plug electrode p1, the first-layer Cu wiring 5, the plug electrode p2, the second-layer Cu wiring 7, the plug electrode p3, and the third-layer Al wiring 9 configuring the guard ring GR each continuously surround the entire periphery of the circuit formation region CR.

Next, as shown in FIG. 3, the scribe region SR has a side surface (side wall) CPss of the semiconductor chip CP. The side surface CPss is a surface positioned between the main surface CPa and the back surface CPb of the semiconductor chip CP. It has a side surface GV1s relatively closer to the guard ring GR, the pad electrode PA, or the circuit formation region CR, a side surface GV2s relatively distant from the guard ring GR, the pad electrode PA, or the circuit formation region CR, and a surface GV1c that connects the side surfaces GV1s and GV2s to each other. In other words, the side surface GV1s close to the guard ring GR, the pad electrode PA, or the circuit formation region CR intersects with the main surface CPa, the side surface GV2s distant from the guard ring GR, the pad electrode PA, or the circuit formation region CR intersects with the back surface CPb, and the surface (connection surface GV1c) positioned between these two side surfaces GV1s and GV2s intersect with these two side surfaces GV1s and GV2s.

The side surface GV1s is continuous from the main surface CPa of the semiconductor chip CP and the side surface GV2s is continuous from the back surface 1b of the semiconductor substrate 1. The side surfaces GV1s and GV2s are perpendicular to the back surface 1b of the semiconductor substrate 1 and the connection surface GV1c is parallel to the back surface 1b of the semiconductor substrate 1. The side surface GV1s may however have a gradient with respect to the back surface of the semiconductor substrate 1. This means that one end of the side surface GV1s connected with the main surface CPa of the semiconductor chip CP may be closer to the guard ring GR, the pad electrode PA, or the circuit formation region CR than the other end of the side surface GV1s connected with the connection surface GV1c. The connection surface GV1c may have a gradient with respect to the back surface 1b of the semiconductor substrate 1. The connection surface GV1c may not only be linear but also be curved such as arc-shaped.

The connection surface GV1c provided as a step difference between the side surface GV1s and the side surface GV2s can stop, at the connection surface GV1c, the adhesive layer AD from creeping up the side surface CPss from the back surface CPb of the semiconductor chip CP and can prevent the adhesive layer AD from reaching the side surface GV1s.

Here, it is important that the length (height) H1 of the side surface GV2s is longer (higher) than the length (height) (H2–H1) of the side surface GV1s, based on the back surface 1b of the semiconductor chip 1. The length (height) H2 is defined as the length (height) of the side surface CPss of the semiconductor chip CP from the back surface CPb of the semiconductor chip CP to the upper surface of the surface protection film 10. In other words, the length (height) H1 of the side surface GV2s is longer (higher) than ½ of the length (height) from the back surface CPb of the semiconductor chip CP to the upper surface of the surface protection film 10. It is to be noted that the back surface CPb of the semiconductor chip CP corresponds to the back surface 1b of the semiconductor substrate 1.

A sufficient height of the side surface GV2s makes it possible to use a large amount of the adhesive layer AD for the adhesion of the semiconductor chip CP to the wiring board SUB. The entirety of the back surface CPb of the semiconductor chip CP can therefore be covered with the adhesive layer AD and generation of voids in the adhesive layer AD between the back surface CPb of the semiconductor chip CP and the wiring board SUB can be reduced or prevented.

It is important that the side surface GV1s is deeper than the bottom portion of the element isolation film 3a. If so, the adhesive layer AD creeping up the side surface CPss from the back surface CPb of the semiconductor chip CP can be prevented from reaching the vicinity of the main surface CPa of the semiconductor chip CP, leading to reduction or prevention of generation of cracks at a joint portion between the pad electrode PA and the bonding wire BW due to a stress caused by the shrinkage of the adhesive layer AD.

When the interlayer insulating film 4, 5a, 6, or 8 is made of a fragile Low-k film and the adhesive layer AD reaches the interlayer insulating film 4, 5a, 6, or 8, cracks may occur or spread from the side surface GV1s to the circuit formation region CR along the interface of the interlayer insulating film 4, 5a, 6 or 8 due to a stress caused by the shrinkage of the adhesive layer AD. In the present embodiment, however, the above-described occurrence or spreading of cracks can be prevented, because the adhesive layer AD does not reach the interlayer insulating film 4, 5a, 6 or 8.

As is apparent from FIG. 3 and FIG. 1, the surface protection film 10 is covered with the organic protection film PI inside the outer pad electrode PA1 (on the center portion side of the main surface CPa of the semiconductor chip CP, on the center portion side of the circuit formation region CR). This means that the organic protection film PI is in contact with the sealing body EB. On the other hand, the surface protection film 10 is not covered with the organic protection film PI outside the outer pad electrode PA1 (on the side of the scribe region SR, on the side of the guard ring GR) and the surface protection film (inorganic protection film) 10 is in contact with the sealing body EB. The configuration in the scribe region SR will next be described in more detail. As shown in FIG. 3, the sealing body EB has a portion contiguous to the surface protection film 10 faulted in a portion of the scribe region SR, a portion contiguous to the connection surface GV1c of the semiconductor chip CP exposed by a dicing step described later, and a portion contiguous to the side surface GV1s positioned between the portion of the scribe region SR and the connection surface GV1c of the semiconductor chip CP. The outer pad electrode PA1 is close to the guard ring GR and a distance L2 between the outer pad electrode PA1 and the guard ring GR is smaller (L2<L1) than a width L1 of the outer pad electrode PA1 in a long side direction, which makes it difficult to arrange the organic protection film PI between the outer pad electrode PA1 and the scribe region SR.

Since the outer pad electrode PA1 has, outside thereof, no organic protection film PI, adhesion between the sealing body EB and the main surface CPa of the semiconductor chip CP is inferior outside the outer pad electrode PA1 compared with inside the outer pad electrode PA1. For example, at the time of temperature cycle or actual use, the sealing body EB is likely to separate from the main surface CPa of the semiconductor chip CP. Separation between the sealing body EB and the main surface CPa of the semiconductor chip CP is likely to cause cracks at the joint portion between the bonding wire BW and the outer pad electrode PA1 at the time of temperature cycle or actual use. The adhesive layer AD that covers the side surface CPss of the semiconductor chip CP however creeps up only the side surface GV2s and does not reach the side surface GV1s. This makes it possible to reduce or prevent cracks generated at the joint portion between the bonding wire BW and the outer pad electrode PA1 due to shrinkage of the adhesive layer AD.

Therefore, the above-described cracks can be reduced or prevented even in a structure having no organic protection film PI outside the outer pad electrode PA1. In addition, since the distance between the outer pad electrode PA1 and the scribe region SR is decreased so as not to arrange the organic protection film PI between the outer pad electrode PA1 and the scribe region SR, the semiconductor chip CP can have a reduced size. Further, the inner pad electrode PA2 shown in FIG. 2 may be replaced by the outer pad electrode PA1 and only the outer pad electrode PA1 may be used as the pad electrodes PA. In this case, the semiconductor chip CP thus provided can have a further reduced size.

<Method of Manufacturing Semiconductor Device>

Figure 4:
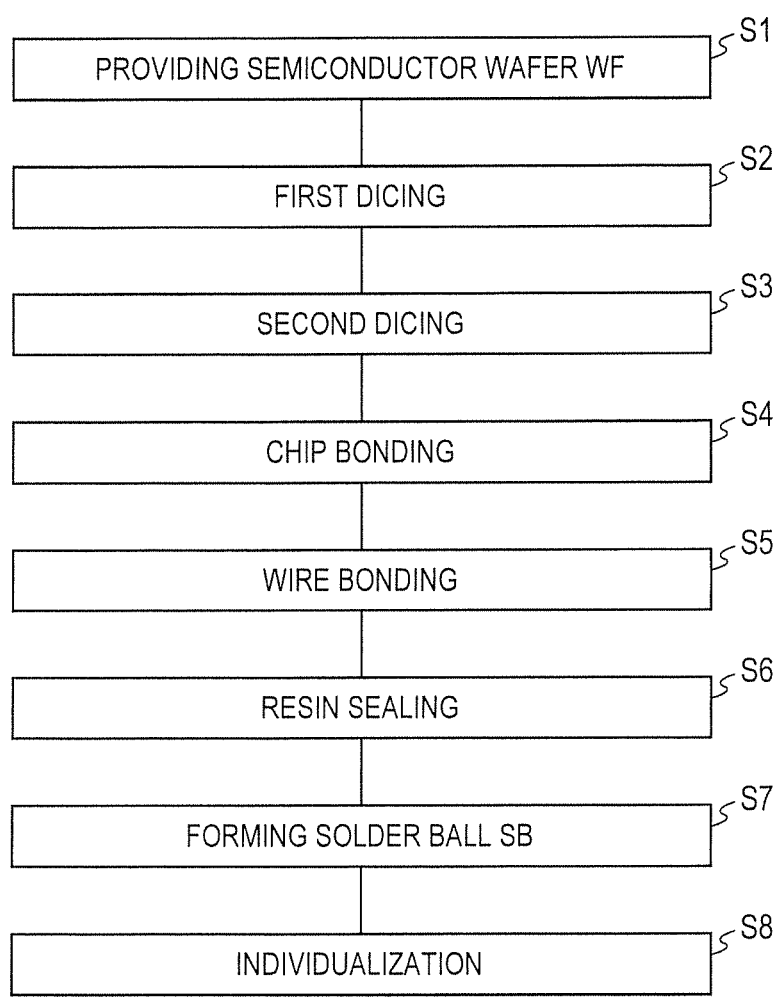
FIG. 4 is a process flow chart showing manufacturing steps of the semiconductor device of First Embodiment.
Figure 5:
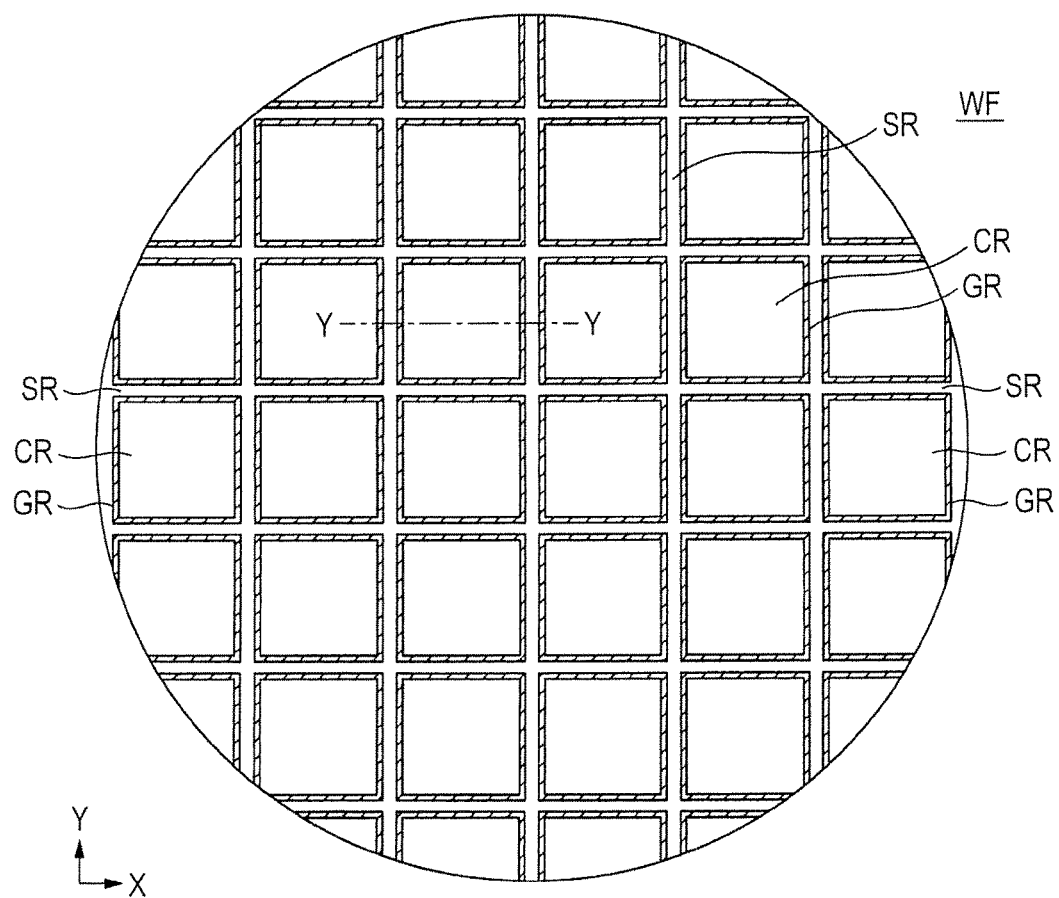
FIG. 5 is a plan view of the semiconductor device of First Embodiment during a manufacturing step thereof.
Figure 6:
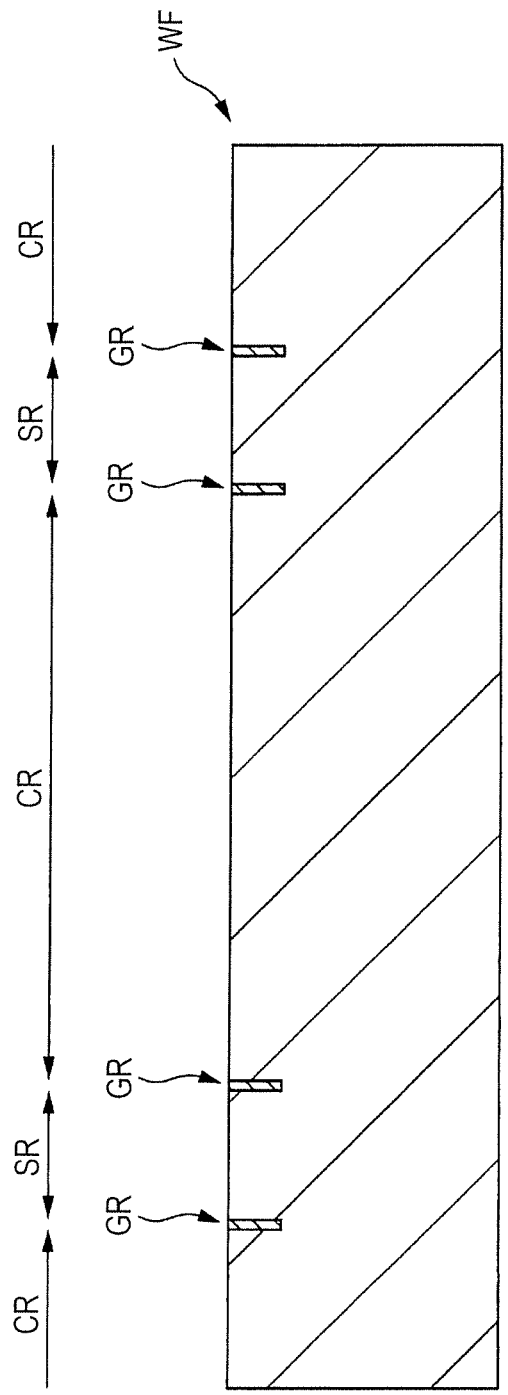
FIG. 6 is a cross-sectional view taken along the line Y-Y of FIG. 5.
Figure 7:
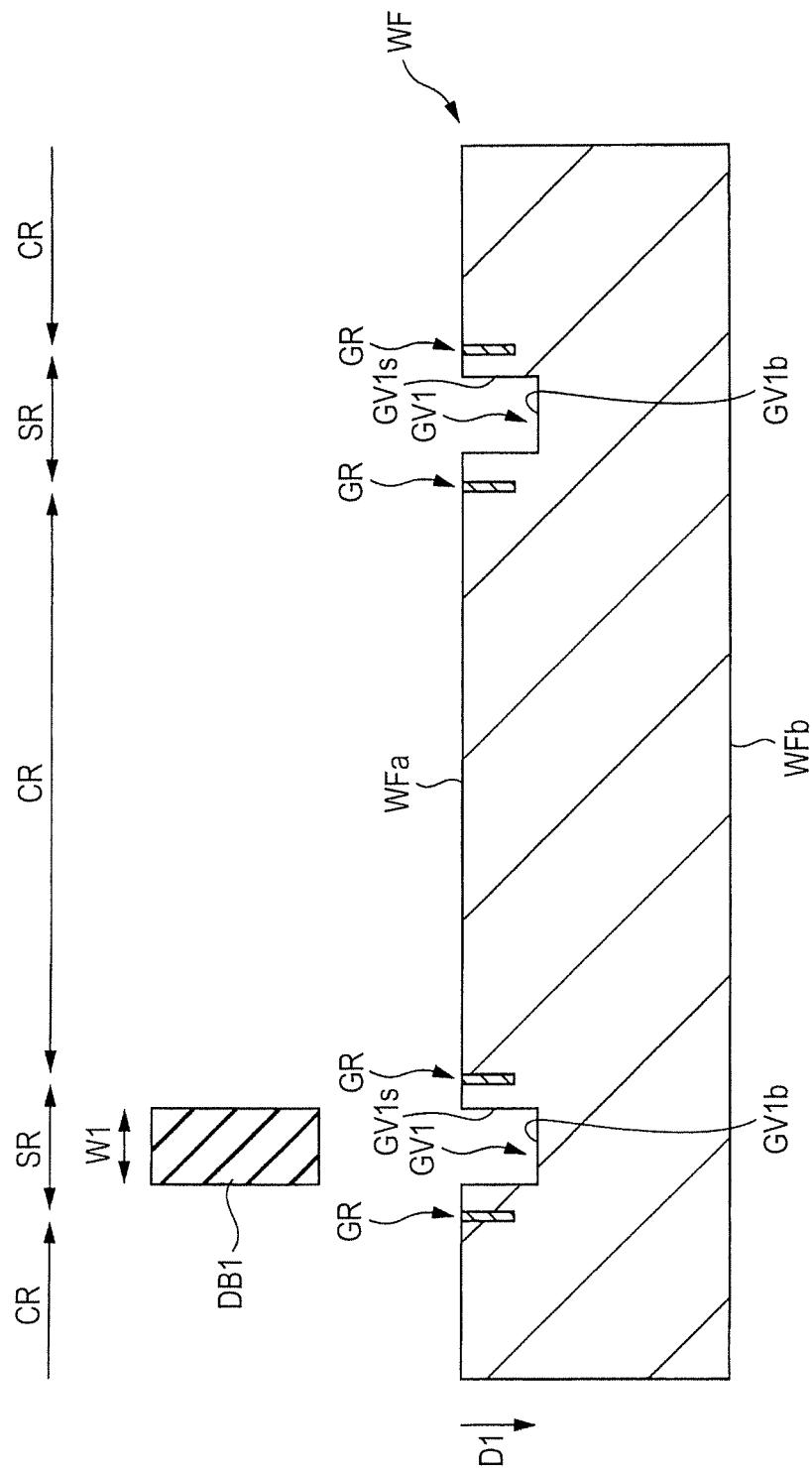
FIG. 7 is a cross-sectional view of the semiconductor device during a manufacturing step following that of FIG. 5.
Figure 8:
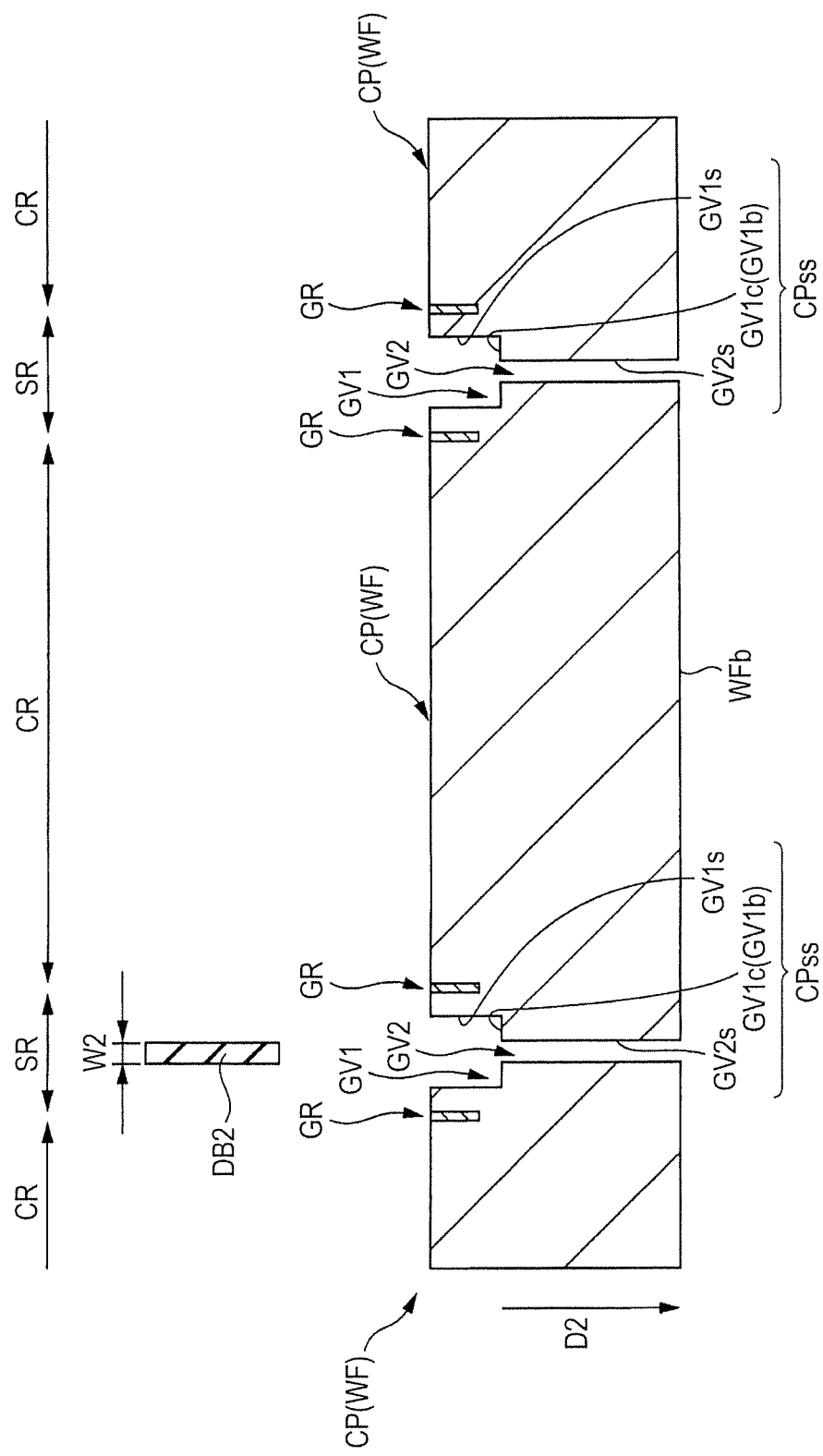
FIG. 8 is a cross-sectional view of the semiconductor device during a manufacturing step following that of FIG. 7.
Figure 9:
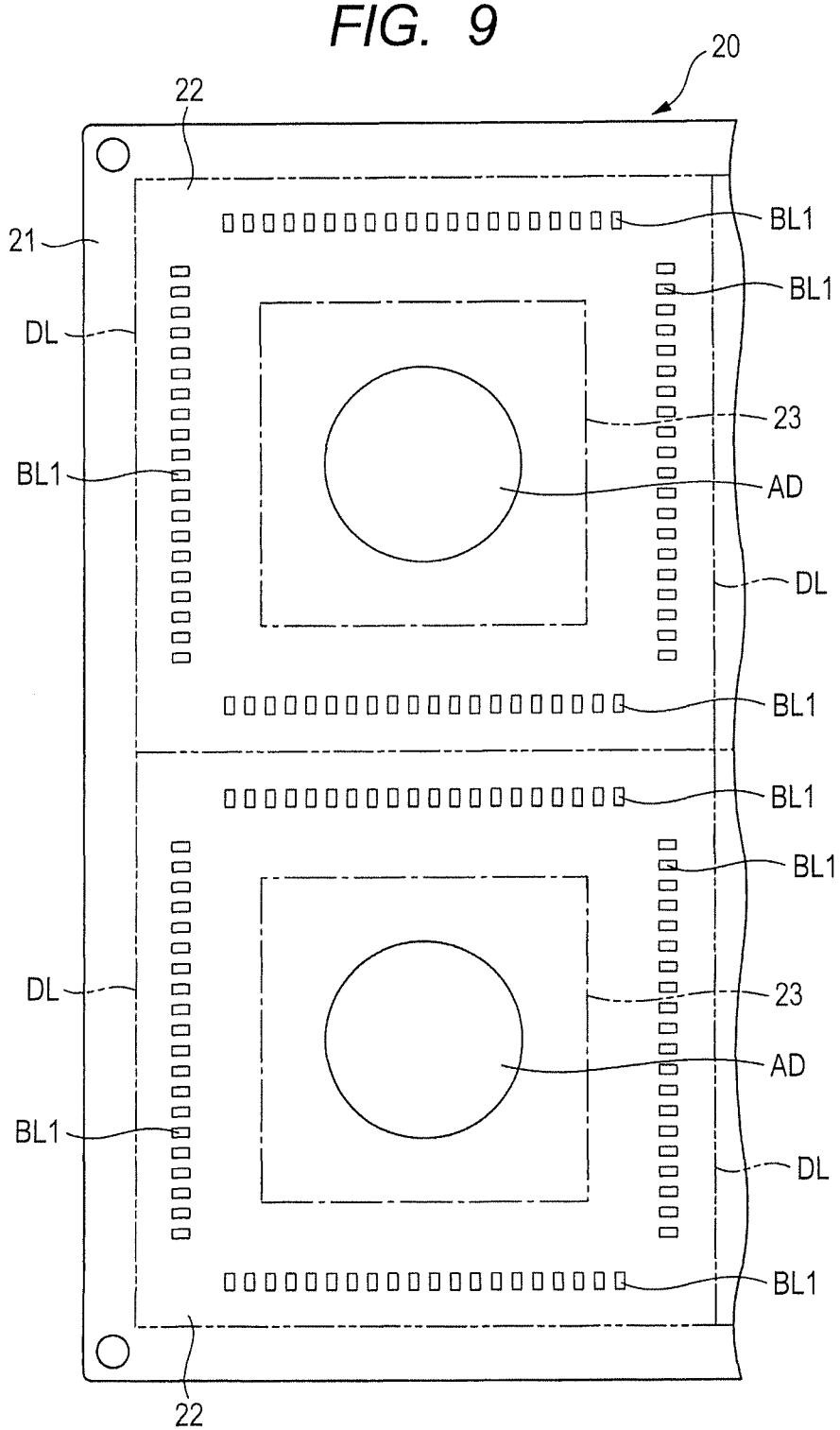
FIG. 9 is a plan view of the semiconductor device during a manufacturing step following that of FIG. 8.
Figure 10:
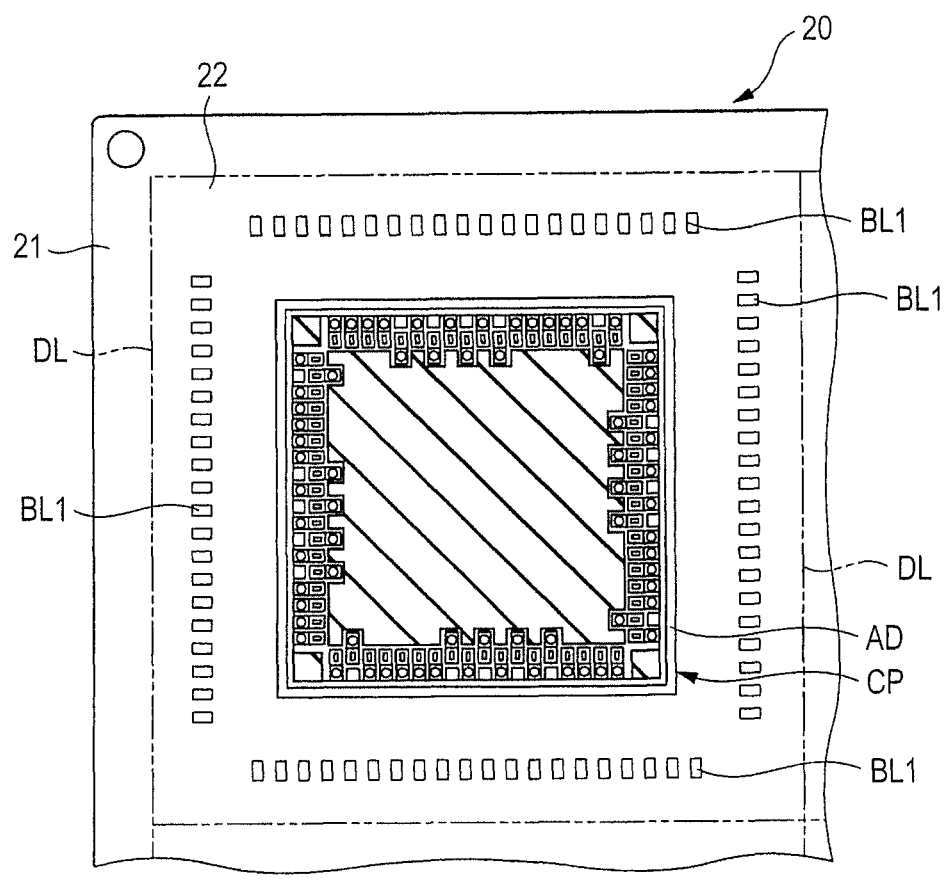
FIG. 10 is a plan view of the semiconductor device during a manufacturing step following that of FIG. 9.
Figure 11:
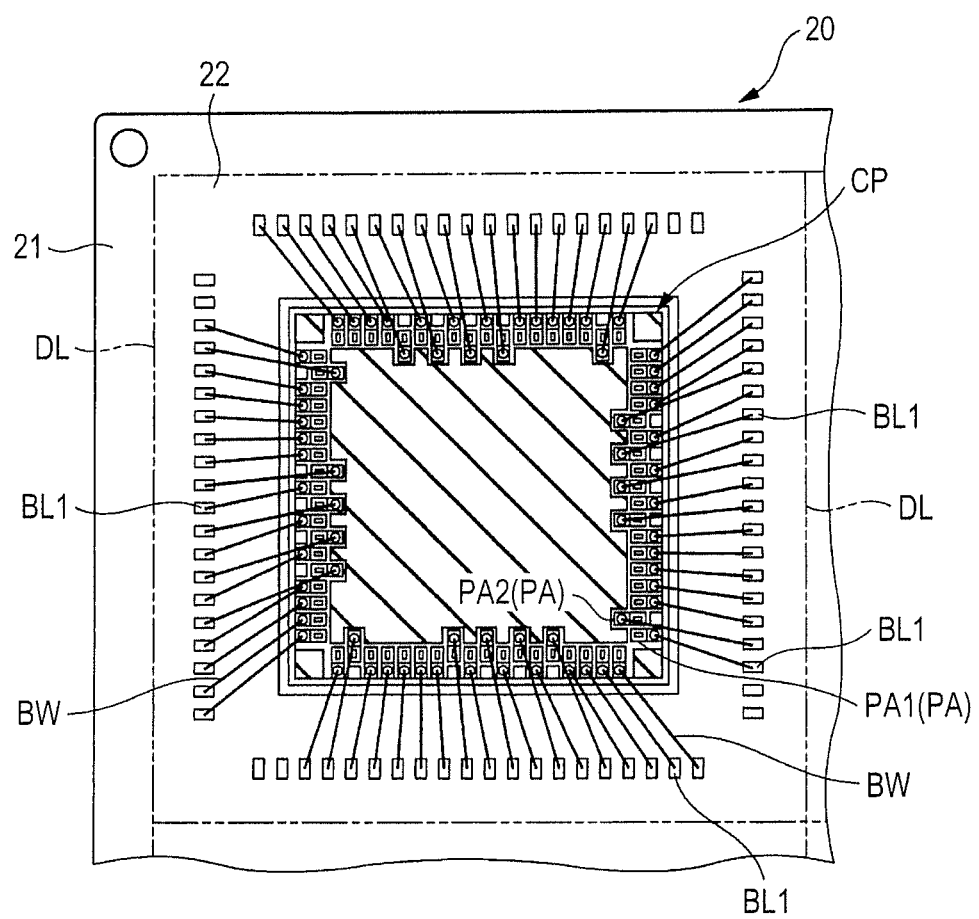
FIG. 11 is a plan view of the semiconductor device during a manufacturing step following that of FIG. 10.
Figure 12:
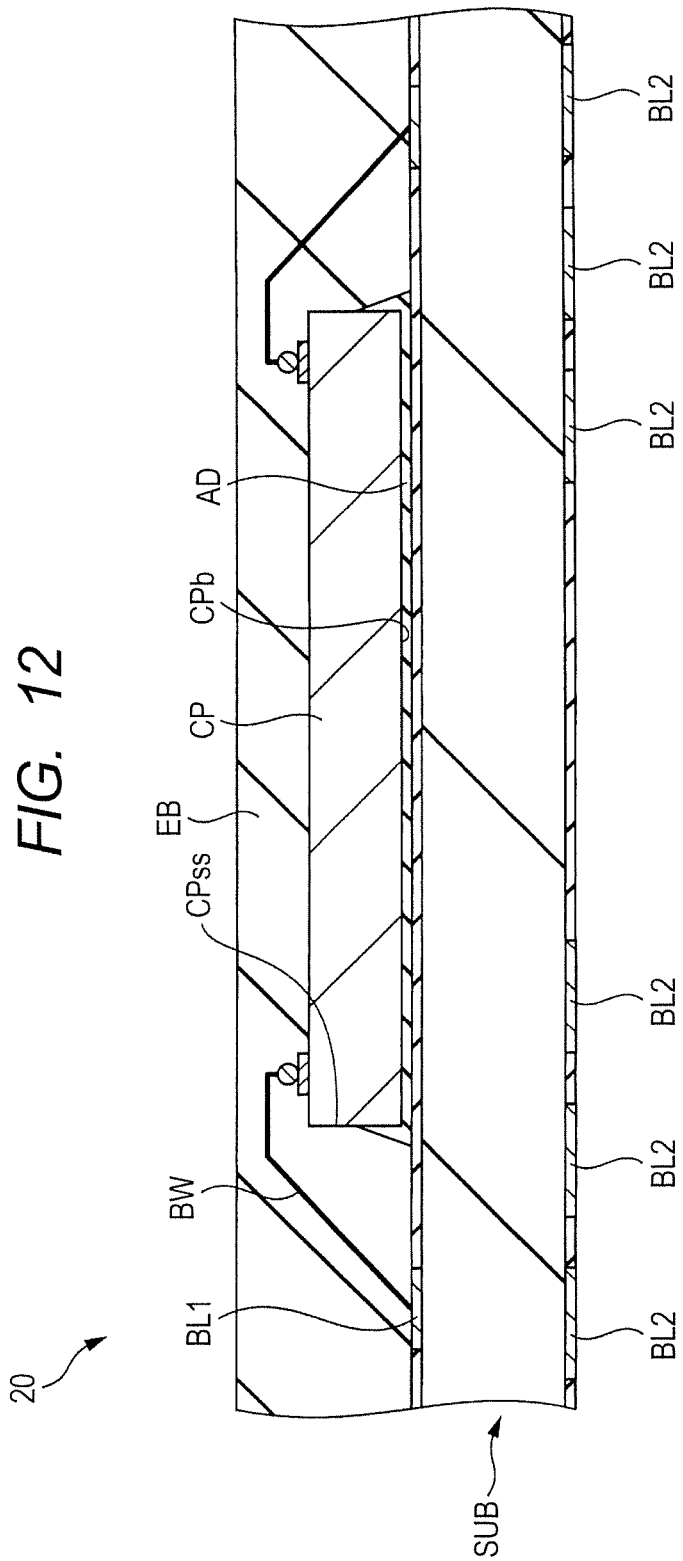
FIG. 12 is a cross-sectional view of the semiconductor device during a manufacturing step following that of FIG. 11.

FIG. 4 is a process flow chart showing manufacturing steps of the semiconductor device of the present embodiment. FIG. 5 is a plan view of the semiconductor device of the present embodiment during a manufacturing step thereof. FIG. 6 is a cross-sectional view taken along the line Y-Y of FIG. 5. FIGS. 7 and 8 are cross-sectional views of the semiconductor device of the present embodiment during manufacturing steps thereof. FIGS. 6 to 8 are schematic cross-sectional views of a semiconductor wafer. FIGS. 9 to 11 are plan views of the semiconductor device of the present embodiment during manufacturing steps thereof. FIG. 12 is a cross-sectional view of the semiconductor device of the present embodiment during a manufacturing step thereof.

The method of manufacturing the semiconductor device of the present embodiment includes manufacturing steps shown in FIG. 4.

First, a "semiconductor wafer WF providing" step (Step S1) shown in the process flow of FIG. 4 is performed.

As shown in FIG. 5, the semiconductor wafer WF has a plurality of circuit formation regions CR arranged in matrix form and a lattice-like scribe region SR arranged between the circuit formation regions CR. As shown in FIG. 3, the circuit formation regions CR each have an n channel MIS transistor (Qn) and a p channel MIS transistor (Qp), and a plurality of multilayer wiring structures and a plurality of pad electrodes PA formed on them. Further, as shown in FIGS. 2 and 3, the circuit formation region CR and the scribe region SR have therebetween a guard ring GR.

FIG. 6 is a cross-sectional view taken along the line Y-Y of FIG. 5. As shown in FIG. 6, the circuit formation regions CR and the scribe regions SR are arranged alternately and the circuit formation region CR and the scribe region SR have, at the boundary thereof, the guard ring GR.

Next, a "first dicing" step (Step S2) shown in the process flow of FIG. 4 is performed.

As shown in FIG. 7, a groove GV1 having a depth D1 and a width W1 is formed in the scribe region SR of the semiconductor wafer WF by a dicing blade DB1 having the width W1. The groove GV1 is formed in the main surface WFa of the semiconductor wafer WF and it does not reach the back surface WFb. In the groove GV1, a side surface GV1s and a bottom surface GV1b are formed. The depth D1 of the groove GV1 is equal to the length (H2−H1) of the side surface GV1s shown in FIG. 3.

Next, a "second dicing" step (Step S3) shown in the process flow of FIG. 4 is performed.

As shown in FIG. 8, a groove GV2 having a depth D2 and a width W2 is formed in the scribe region SR of the semiconductor wafer WF by a dicing blade DB2 having the width W2. The width W2 of the groove GV2 is smaller (W2<W1) than the width W1 of the groove GV1 and the groove GV2 is formed inside the groove GV1. This means that the groove GV2 extends from a bottom surface GV1b of the groove GV1 and reaches the back surface WFb of the semiconductor wafer WF. In the groove GV2, a side surface GV2s is formed, while between the side surface GV2s and the side surface GV1s, a connection surface GV1c which is a portion of the bottom surface GV1b is formed. The depth D2 of the groove GV2 is equal to the length H1 of the side surface GV2s shown in FIG. 3.

In such a manner, the semiconductor wafer WF is subjected to the "first dicing" step and the "second dicing" step to form a plurality of semiconductor chips CP from the semiconductor wafer WF. Individual semiconductor chips CP thus obtained have the side surface CPss including the side surface GV1s, the side surface GV2s, and the connection surface GV1c.

Next, a "chip bonding" step (Step S4) shown in the process flow of FIG. 4 is performed.

First, as shown in FIG. 9, a matrix board (base material) 20 is provided. The matrix board 20 has a plurality of device regions 22 arranged in matrix form, a frame portion 21 surrounding the device regions 22 arranged in matrix form, and a dicing line DL provided between the frame portion 21 and the device regions 22 and between two adjacent device regions 22. The device regions 22 each have therein a chip mounting portion 23 and a plurality of bonding lands BL1 arranged therearound. The chip mounting portion 23 has a planar shape same as that of the semiconductor chip CP shown in FIG. 2.

Next, as shown in FIG. 9 a paste-like adhesive layer AD is roundly applied to the center portion of the chip mounting portion 23. The adhesive layer AD is made of, for example, an epoxy resin containing a filler such as alumina.

Next, as shown in FIG. 10, the semiconductor chip CP is pressed against the chip mounting portion 23 shown in FIG. 9 and the semiconductor chip CP is bonded to the device region 22 of the matrix board 20 via the adhesive layer AD. The semiconductor chip CP is bonded to the device region 22 by heating the paste-like adhesive layer AD and thereby vaporizing the solvent therein. This device region 22 corresponds to the wiring board SUB shown in FIG. 1. Since a relatively large amount of the paste-like adhesive layer AD is applied in order to cover the entirety of the back surface CPb of the semiconductor chip CP with the adhesive layer AD, the adhesive layer AD, as shown in FIG. 10, protrudes from the periphery of the semiconductor chip CP over the entire periphery of the semiconductor chip CP and creeps up the side surface CPss of the semiconductor chip CP as shown in FIG. 3.

Since the side surface CPss of the semiconductor chip CP has the side surface CV1s and the side surface CV2s, the adhesive layer AD, as shown in FIG. 3, covers only the side surface GV2s and does not cross over the connection surface GV1c to reach the side surface GV1s.

Next, a "wire bonding" step (Step S5) shown in the process flow of FIG. 4 is performed.

As shown in FIG. 11, a plurality of outer pad electrodes PA1 and a plurality of inner pad electrodes PA2 formed in the semiconductor chip CP are connected with the bonding lands BL1 by a bonding wire BW. The bonding wire BW is made of, for example, a copper (Cu) wire, but a gold (Au) wire may be used instead.

Next, a "resin sealing" step (Step S6) shown in the process flow of FIG. 4 is performed.

As shown in FIG. 12, after completion of the "chip bonding" step and the "wire bonding" step, the semiconductor chips CP and the bonding wires BW on the matrix board 20 are covered with the sealing body EB. In the "resin sealing" step, for example, a transfer molding method is used. FIG. 12 shows only one of the device regions 22.

Next, a "solder ball SB formation" step (Step S7) and an "individualization" step (Step S8) shown in the process flow of FIG. 4 are performed.

Next, after formation of a solder ball SB on a ball land BL2 of the matrix board 20 shown in FIG. 12, the sealing body EB and the matrix board 20 are cut along the dicing line DL shown in FIG. 9 to obtain individual semiconductor devices SD shown in FIG. 1.

Modification Example

The invention made by the present inventors has been described above specifically based on the above embodiment. It is needless to say that the invention is not limited to or by the above embodiment but can be changed in various ways without departing from the gist of the invention. The following are some modification examples and these modification examples may be used in combination as needed.

Modification Example 1

Figure 13:
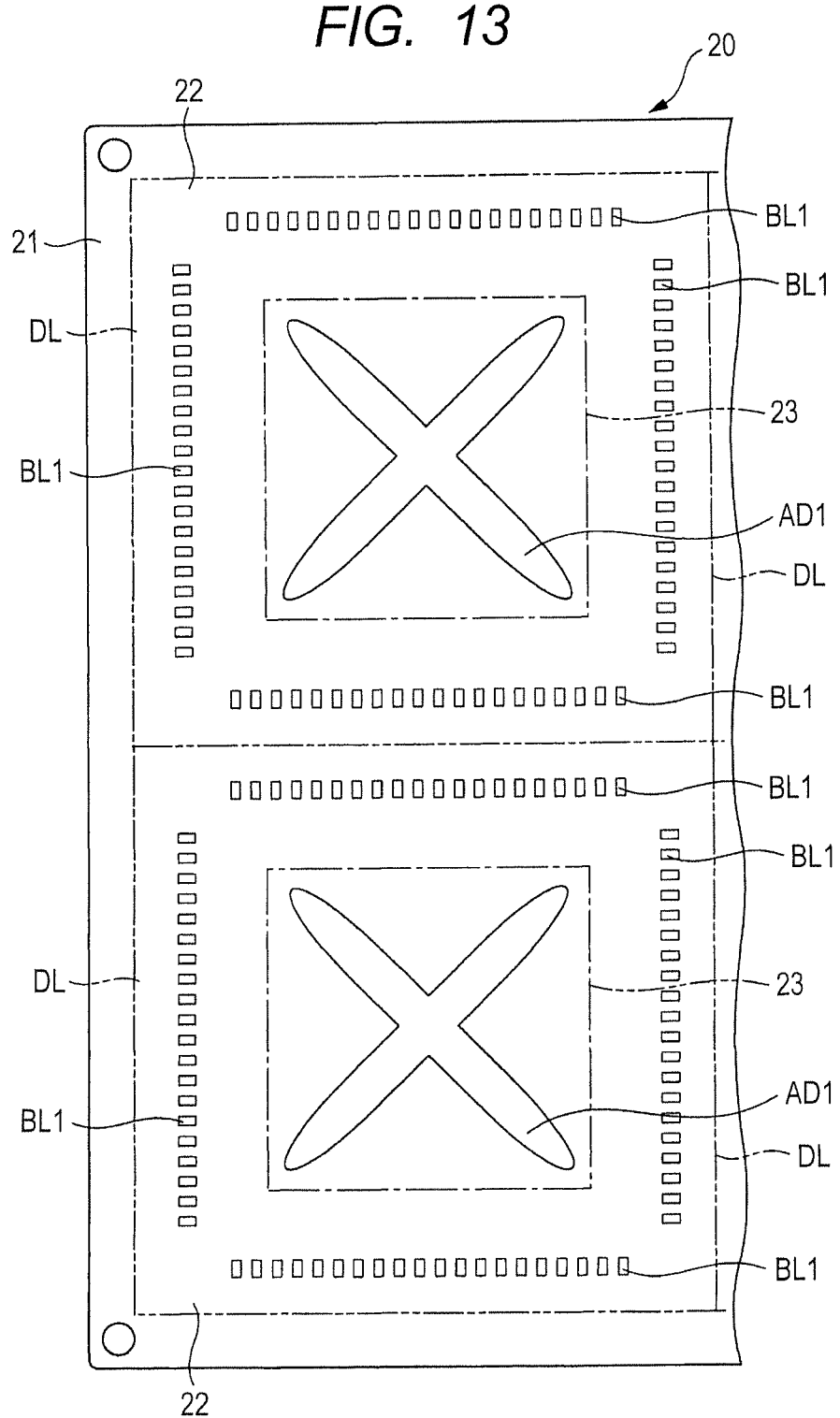
FIG. 13 is a plan view showing a modification example corresponding to that of FIG. 9.

FIG. 13 is a modification example of the above embodiment with respect to FIG. 9.

In FIG. 13, the paste-like adhesive layer AD1 is applied in cross shape so as to connect the corner portions of the square chip mounting portion 23 of the matrix board 20 opposite to each other. This cross-shaped application region of the adhesive layer AD1 makes it possible to form the adhesive layer AD1 having a uniform thickness on the back surface CPb of the semiconductor chip CP.

In the above embodiment, a description has been made using a BGA type semiconductor device as an example but a QFP (quad flat package) type or SOP (small outline package) type semiconductor device can also be used. In this case, the wiring board (base material) SUB of the above embodiment is replaced by a leadframe (base material) and the bonding land BL1 is replaced by a lead (terminal). The semiconductor chip CP is mounted on the main surface of a die pad (tab, chip mounting portion) of the leadframe via the adhesive layer AD. The die pad and the lead are each made of, for example, a copper (Cu) material.

What is claimed is:

1. A semiconductor device, comprising:
 a base material,
 a plurality of terminals positioned around the base material;
 a semiconductor chip mounted over the base material via an adhesive layer and having a plurality of first pad electrodes;
 a plurality of bonding wires connecting the plurality of first pad electrodes with the plurality of terminals; and
 a sealing body sealing the base material, the plurality of terminals, the semiconductor chip and the plurality of bonding wires,
 wherein the semiconductor chip has a first main surface, a back surface opposite to the first main surface, and a side surface positioned between the first main surface and the back surface,
 wherein the first main surface is comprised of a shape including a first side,
 wherein the first main surface has a circuit formation region and a scribe region surrounding the circuit formation region,
 wherein the plurality of first pad electrodes is arranged along the first side, and arranged in the peripheral portion of the circuit formation region,
 wherein the semiconductor chip has a first protection film that is comprised of an inorganic insulating film, and exposes the plurality of first pad electrodes, and covers the circuit formation region and a portion of the scribe region, and a second protection film that is comprised of an organic insulating film, and formed over the first protection film, and exposes the plurality of first pad electrodes and the scribe region, and covers the circuit formation region,
 wherein the sealing body is in contact with the second protection film in the circuit formation region, and in contact with the first protection film in the portion of the scribe region and a region between the plurality of first pad electrodes and the scribe region without being in contact with the second protection film,
 wherein the side surface of the semiconductor chip has a first side surface positioned in the scribe region and reaching to the first main surface, and a second side surface positioned in the scribe region and reaching to the back surface, the first side surface is positioned closer to the circuit formation region than the second side surface, and the second side surface is longer than the first side surface, and
 wherein the adhesive layer covers both the entirety of the back surface of the semiconductor chip and the second side surface of the semiconductor chip, and the first side surface is in contact with the sealing body without being covered with the adhesive layer.

2. The semiconductor device according to claim 1,
 wherein the semiconductor chip has a semiconductor substrate having a second main surface and an active region formed in the second main surface and surrounded with an element isolation film, and
 wherein the circuit formation region of the semiconductor chip is formed in the active region and has a MISFET including a gate electrode, a source region, and a drain region.

3. The semiconductor device according to claim 2,
 wherein compared with the element isolation film, the first side surface reaches a back surface side of the semiconductor chip, with the first main surface as a reference.

4. The semiconductor device according to claim 1, further comprising a guard ring positioned between the circuit formation region and the scribe region in plan view and continuously surrounding the circuit formation region.

5. The semiconductor device according to claim 4, further comprising an interlayer insulating film formed below the plurality of first pad electrodes,
 wherein the interlayer insulating film is in contact with plurality of the first pad electrodes, and
 wherein the guard ring includes a wiring layer formed in contact with an upper portion of the interlayer insulating film.

6. The semiconductor device according to claim 5,
 wherein the guard ring includes a plug electrode buried in the interlayer insulating film and connected with the wiring layer.

7. The semiconductor device according to claim 4,
 wherein the plurality of first pad electrodes each have a first bonding region with which the bonding wire is connected and a first probe region adjacent to the first bonding region, and
 wherein in a direction orthogonal to the first side, the first bonding region is arranged on a side closer to the first side than the first probe region.

8. The semiconductor device according to claim 7,
 wherein the plurality of first pad electrodes each have a first width in a direction orthogonal to the first side and are separated by a first distance from the guard ring extending along the first side, and
 wherein the first distance is smaller than the first width.

9. The semiconductor device according to claim 7, further comprising a second pad electrode arranged along the first side;
 wherein the second pad electrode has a second bonding region with which the bonding wire is connected and a second probe region adjacent to the second bonding region, and
 wherein in a direction orthogonal to the first side, the second probe region is arranged on a side closer to the first side than the second bonding region.

10. The semiconductor device according to claim 9,
 wherein the first probe region and the second probe region are linearly arranged in a direction parallel to the first side.

11. The semiconductor device according to claim 9,
 wherein in a direction orthogonal to the first side, the second pad electrode and the first side have therebetween the second protection film.

12. The semiconductor device according to claim 1,
 wherein the semiconductor chip has single crystal silicon, and
 wherein the adhesive layer and the sealing body each have an epoxy resin.

13. A method of manufacturing a semiconductor device, comprising the steps of:
 (a) providing a semiconductor wafer having a circuit formation region, a scribe region surrounding the circuit formation region, and a plurality of pad electrodes formed at the peripheral portion of the circuit formation region;
 (b) forming a first groove having a first depth and a first width along the scribe region;

(c) forming, along the scribe region, a second groove having a second depth deeper than the first depth and a second width narrower than the first width in the first groove and dividing the semiconductor wafer into a plurality of semiconductor chips;

(d) bonding the semiconductor chip over a base material having a plurality of terminals via an adhesive layer;

(e) connecting the pad electrodes of the semiconductor chip with the plurality of terminals with a plurality of bonding wires; and (f) sealing the base material, the plurality of terminals, the semiconductor chip, and the plurality of bonding wires with a resin to form a sealing body, wherein the semiconductor chip has a first main surface, a back surface positioned on the a opposite to the first main surface, and a side surface positioned between the first main surface and the back surface, wherein the first main surface is comprised of a shape including a first side and has a circuit formation region and a scribe region surrounding the circuit formation region, wherein the semiconductor chip has a first protection film that is comprised of an inorganic insulating film, and exposes the pad electrodes, and covers the circuit formation region and a portion of the scribe region and a second protection film that is comprised of an organic insulating film, and formed over the plurality of first protection film, and covers the circuit formation region while exposing the pad electrodes and the scribe region, wherein the sealing body is in contact with the second protection film in the circuit formation region and in contact with the first protection film in the portion of the scribe region and in a region between the pad electrodes and the scribe region without being in contact with the second protection film, wherein the side surface of the semiconductor chip has a first side surface obtained by the formation of the first groove, a second side surface obtained by the formation of the second groove, and a connection surface that connects between the first side surface and the second side surface, and wherein the adhesive layer covers the entirety of the back surface of the semiconductor chip and the second side surface of the semiconductor chip and the first side surface is in contact with the sealing body without being covered with the adhesive layer.

14. The method of manufacturing a semiconductor device according to claim 13, wherein the step (d) comprises the steps of:

(d-1) supplying the adhesive layer to the base material; and (d-2) pressing the semiconductor chip against the adhesive layer.

15. The method of manufacturing a semiconductor device according to claim 14, wherein in the step (d-1), the adhesive layer supplied has a round shape in plan view.

16. The method of manufacturing a semiconductor device according to claim 14, wherein the semiconductor chip has a rectangular shape in plan view, and wherein in the step (d-1), in plan view, the adhesive layer supplied has a cross shape so as to connect between corner portions of the rectangular semiconductor chip opposite to each other.

* * * * *